United States Patent
Kumar et al.

(10) Patent No.: US 9,209,240 B2
(45) Date of Patent: Dec. 8, 2015

(54) METAL-OXIDE-METAL CAPACITOR STRUCTURE

(71) Applicants: Santhosh Kumar, Bangalore (IN); Smitha Naganna, Bangalore (IN); Deepak Pancholi, Bangalore (IN)

(72) Inventors: Santhosh Kumar, Bangalore (IN); Smitha Naganna, Bangalore (IN); Deepak Pancholi, Bangalore (IN)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/772,916

(22) Filed: Feb. 21, 2013

(65) Prior Publication Data

US 2014/0103490 A1    Apr. 17, 2014

(30) Foreign Application Priority Data

Oct. 16, 2012 (IN) ............................ 4319/CHE/2012

(51) Int. Cl.
    *H01G 4/232* (2006.01)
    *H01L 49/02* (2006.01)
    *H01L 23/522* (2006.01)

(52) U.S. Cl.
    CPC ............... *H01L 28/60* (2013.01); *H01G 4/232* (2013.01); *H01L 23/5223* (2013.01); *H01L 28/86* (2013.01); *H01L 28/91* (2013.01); *H01L 28/90* (2013.01); *H01L 2924/0002* (2013.01)

(58) Field of Classification Search
    CPC ......... H01L 28/60; H01L 28/86; H01L 28/90; H01L 28/91; H01L 23/5223; H01G 4/228; H01G 4/232
    USPC ............................ 257/532; 361/303; 438/957
    See application file for complete search history.

(56) References Cited

U.S. PATENT DOCUMENTS

| | | | |
|---|---|---|---|
| 6,661,638 B2 | 12/2003 | Jackson et al. | |
| 7,630,225 B2 | 12/2009 | Dunlop et al. | |
| 7,633,799 B2 | 12/2009 | Gorobets et al. | |
| 7,730,270 B2 | 6/2010 | Dunlop et al. | |
| 7,881,041 B1 * | 2/2011 | Chen et al. | 361/306.1 |
| 7,978,456 B2 * | 7/2011 | Fong et al. | 361/306.2 |
| 8,536,016 B2 * | 9/2013 | Chu et al. | 438/396 |
| 8,916,919 B2 * | 12/2014 | Thompson et al. | 257/307 |
| 2006/0006496 A1 * | 1/2006 | Harris et al. | 257/532 |
| 2006/0061935 A1 * | 3/2006 | Schultz et al. | 361/306.1 |
| 2007/0057344 A1 * | 3/2007 | Lee | 257/532 |

(Continued)

FOREIGN PATENT DOCUMENTS

WO    WO 96/27907    9/1996

OTHER PUBLICATIONS

Zhang et al., "Calculation of the Via-Plate Capacitance of a Via with Pad Using Finite Difference Method for Signal/Power Integrity Analysis," EMC '09/Kyoto, 21Q3-1, 2009 IEICE, pp. 141-144 (4 pp.).

*Primary Examiner* — Allan R Wilson
(74) *Attorney, Agent, or Firm* — Brinks Gilson & Lione

(57) ABSTRACT

A capacitor from a Metal-Oxide-Metal ("MoM") process may include a plurality of metal layers arranged with different design structures. The metal layers may be connected with vias. The metal layers may include wires, such as rows and/or fingers that are arranged for maximizing capacitance between adjacent fingers, as well as between fingers of different metal layers. As the spacing of the fingers is increased, the reliability, yield of final product, and ease of manufacturing both increase. The capacitor increases the spacing of wires/fingers while either maintaining or improving the capacitance per unit area.

12 Claims, 7 Drawing Sheets

(56) References Cited

U.S. PATENT DOCUMENTS

| | | |
|---|---|---|
| 2008/0128857 A1 | 6/2008 | Bi |
| 2011/0149468 A1* | 6/2011 | Picollet et al. ............. 361/306.3 |
| 2012/0007214 A1 | 1/2012 | Chu et al. |
| 2013/0148258 A1* | 6/2013 | Chen ............................ 361/303 |
| 2013/0200489 A1* | 8/2013 | Huang et al. .................. 257/532 |
| 2014/0291806 A1* | 10/2014 | Huang et al. .................. 257/532 |

* cited by examiner

US 9,209,240 B2

METAL-OXIDE-METAL CAPACITOR STRUCTURE

PRIORITY CLAIM

This application claims priority to India Patent Application 4319/CHE/2012 filed on Oct. 16, 2012, entitled "METAL-OXIDE-METAL CAPACITOR STRUCTURE," the entire disclosure of which is hereby incorporated by reference.

TECHNICAL FIELD

This application relates generally to an integrated circuit that may be used in many electronic devices, such as a temperature sensor. More specifically, this application relates to an on-chip capacitor that is part of the integrated circuit.

BACKGROUND

Integrated circuits are used in many electronic devices and may include a number of different devices, such as on-chip capacitors. The design and fabrication of such capacitors for high frequency applications may be designed for installation onto a semiconductor substrate using a Metal-Oxide-Metal ("MoM") process. There may be a common design for capacitors that is standardized for simplified fabrication. The structure and organization of the different metal layers may be modified to improve capacitance per unit area. Vias or via layers may be utilized to connect different metal layers.

SUMMARY

It may be desirable to improve capacitance per unit area for a Metal-Oxide-Metal ("MoM") capacitor. Improved reliability without reducing capacitance per unit area is also desirable. The capacitor may include a plurality of metal layers arranged as different structures and including vias or via layers that connect the metal layers. The metal layers may include wires, such as rows and/or fingers that are arranged for capacitance between adjacent fingers, as well as between fingers of different metal layers. As the spacing of the fingers is increased, the reliability and ease of manufacturing both increases. Accordingly, a structure design with greater spacing is easier to manufacture and less likely to short. The embodiments described below improve the spacing while either maintaining or improving the capacitance per unit area.

BRIEF DESCRIPTION OF THE PRESENTLY PREFERRED EMBODIMENTS

There may a number of devices that rely on an integrated circuit that includes MoM capacitors. MoM capacitors may be used in circuits where high linearity is required, which may be true for any system which uses IP's like an analog-to-digital converter. In one example, a temperature sensor may utilize such a capacitor to improve the linearity of system. The capacitor may include a plurality of metal layers arranged as different structures and including vias or via layers that connect the metal layers. The metal layers may be metal wires (e.g. traces, rows and/or fingers) that are arranged for capacitance between adjacent wires, as well as between wires of different metal layers. The capacitor stores charge between the metal layers and/or between the fingers/rows of the metal wires. An improved capacitor may hold a higher charge while taking up less space, and have improved reliability or easier manufacturing. As described below, the capacitor structures may have a greater spacing between wires which improves reliability and simplifies the manufacturing process. Improved reliability while maximizing an amount of charge (or a "capacitance" measures in Farads) per unit area results in a more optimized capacitor. The integrated circuit chips that may include such structures may operate on the nanometer or micrometer scale for sizing.

The integrated circuit may include a capacitor primitive cell ("Pcell") layout. There may be a plurality of metal layers that are formed to create a particular structure or layout. The metal layers may be overlapping or on top of one another. The layers may be referred to as plates in one embodiment, or the capacitor may include a top plate and a bottom plate. The top plate and bottom plate may be made from the same metal. In alternative embodiments, there may be more or fewer metal layers and those layers may each have slightly different structures as described below. Further, the metals for each of the layers may be varied. FIGS. 1-7 represent one or more layers that are part of one of more structures that include a plurality of metal layers.

Figure 1:
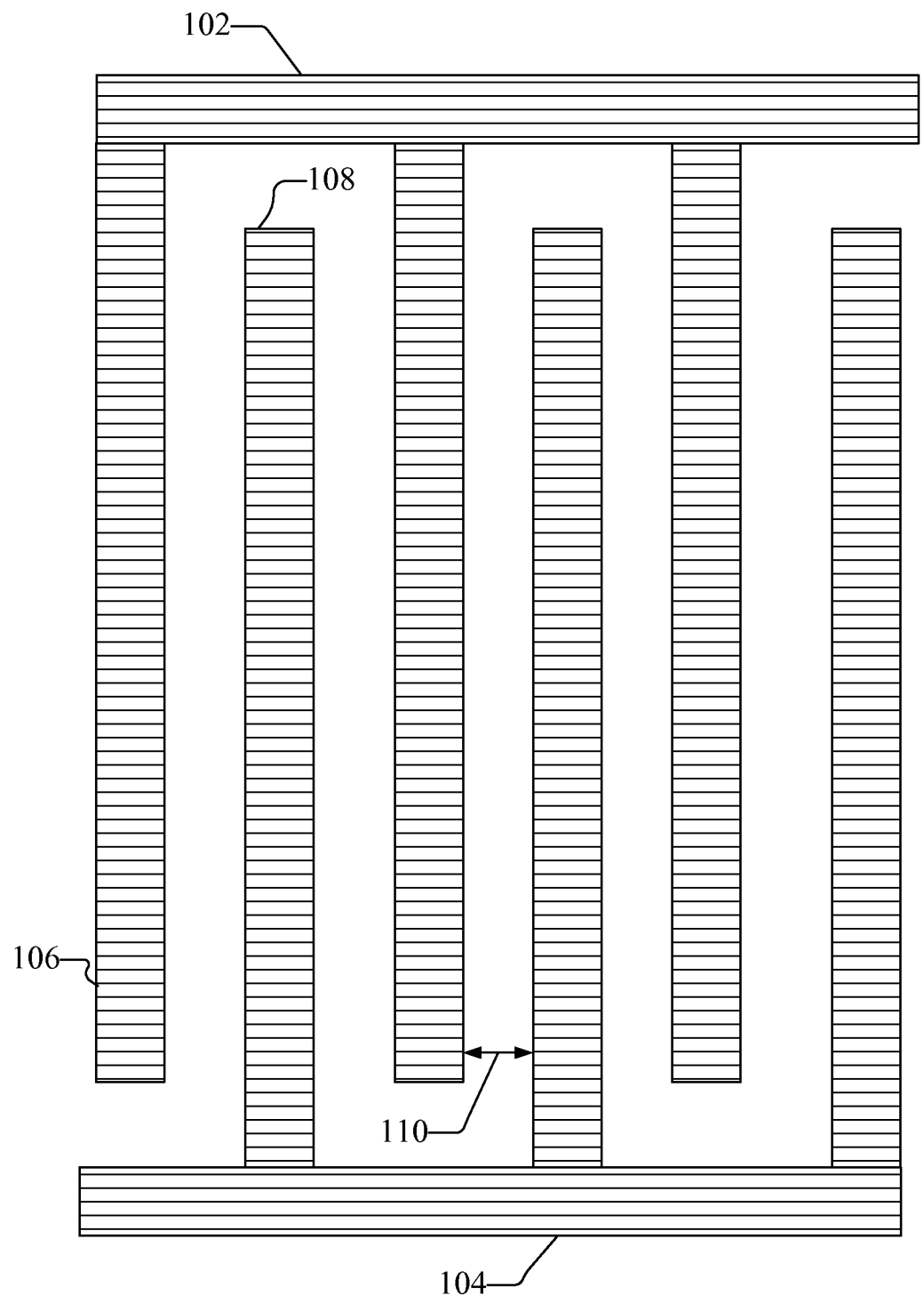
FIG. 1 is a diagram of at least one metal layer that is part of a capacitor structure.

FIG. 1 is a diagram of at least one metal layer that is part of a first capacitor structure. The structure may include a plurality of metal layers that each include a plurality of metal wires/fingers that form the structure. In one embodiment, FIG. 1 illustrates an exemplary arrangement of one metal layer, however, the first capacitor structure may include a plurality of metal layers (of the same or different metals) with the same arrangement.

As shown, there is a top row 102 and a bottom row 104. The top row 102 and/or bottom row 104 may be referred to as the top wire or bottom wire, respectively. There may be a plurality of fingers (e.g. finger 106 and finger 108) extending from one or both of the top row 102 or the bottom row 104. The top row 102, the bottom row 104, and each of the fingers (e.g. 106, 108) may be layers of metal as described above. As shown, finger 106 extends from the top row 102 and finger 108 extends from the bottom row 104. As shown (not labeled) every other finger after finger 106 extends from the top row 102 and every other finger after finger 108 extends from the bottom row 104. The number of fingers illustrated in FIG. 1 is merely exemplary and there may be additional fingers arranged in a different manner. In one embodiment, there may be a total of sixteen fingers with eight of them extending from the top row 102 and eight of them extending from the bottom row 104.

The fingers (e.g. 106, 108) establish the capacitance of the structure. The gaps between the fingers establishes the capacitance between the sides of the two adjacent metals. The rows and/or fingers may be electrically insulated from one another with a dielectric material (not shown). Generally, opposing fingers/rows in the same metal layer belong to opposing signal nodes. The capacitance between adjacent metal fingers in the same metal layer may be referred to as a sidewall capacitance or fringe capacitance. There may be a capacitance between adjacent metal layers from overlapping metal fingers that may be referred to as an overlap capacitance. When different metals lay over each other, they may be connected together with vias (discussed below) to form plate A and plate B, in which case they will be shorted and no overlapping capacitance will exist in that example. The overlapping capacitance may result if different metal layers overlapped on each other are not connected with a via. A larger number of fingers may result in a greater capacitance. Further, the length of fingers can also increase capacitance, but more fingers and longer fingers require more space, so there may be an optimal amount and length of fingers to optimize the capacitance per unit area.

FIG. 1 illustrates an exemplary gap 110 between fingers. Although not labeled, the gap 110 may be the same for the gaps between all the fingers and rows. In one embodiment, the gap between fingers may be 90 nanometers. Other capacitor structures may have more fingers (e.g. 19) with a smaller spacing (e.g. 70 nanometers). However, manufacturing defects and uncertainty may result in difficulties in maximizing the capacitance per unit area. As mentioned, although additional fingers can increase capacitance, but as the gap 110 is closed, there may be a larger increase in defects and manufacturing errors. In other words, manufacturing may be easier and more reliable and provide higher yields of the product using such capacitor structures if the spacing of the gap 110 between fingers is increased. Accordingly, the gap 110 shown in FIG. 1 may be increased from 70 nm to 90 nm with fewer fingers (17 fingers rather than 19 fingers).

Reliability may also be increased as the gap 110 between fingers is increased. For example, if the temperature of the chip increases, it may be possible for the metal (wires that comprise the rows and fingers) to melt and potentially cause a short. A larger gap 110 may result in a decreased chance that the melting metal will overlap with one another and create a short. In other words, the reliability of the chip is increased with increased finger spacing.

Figure 2:
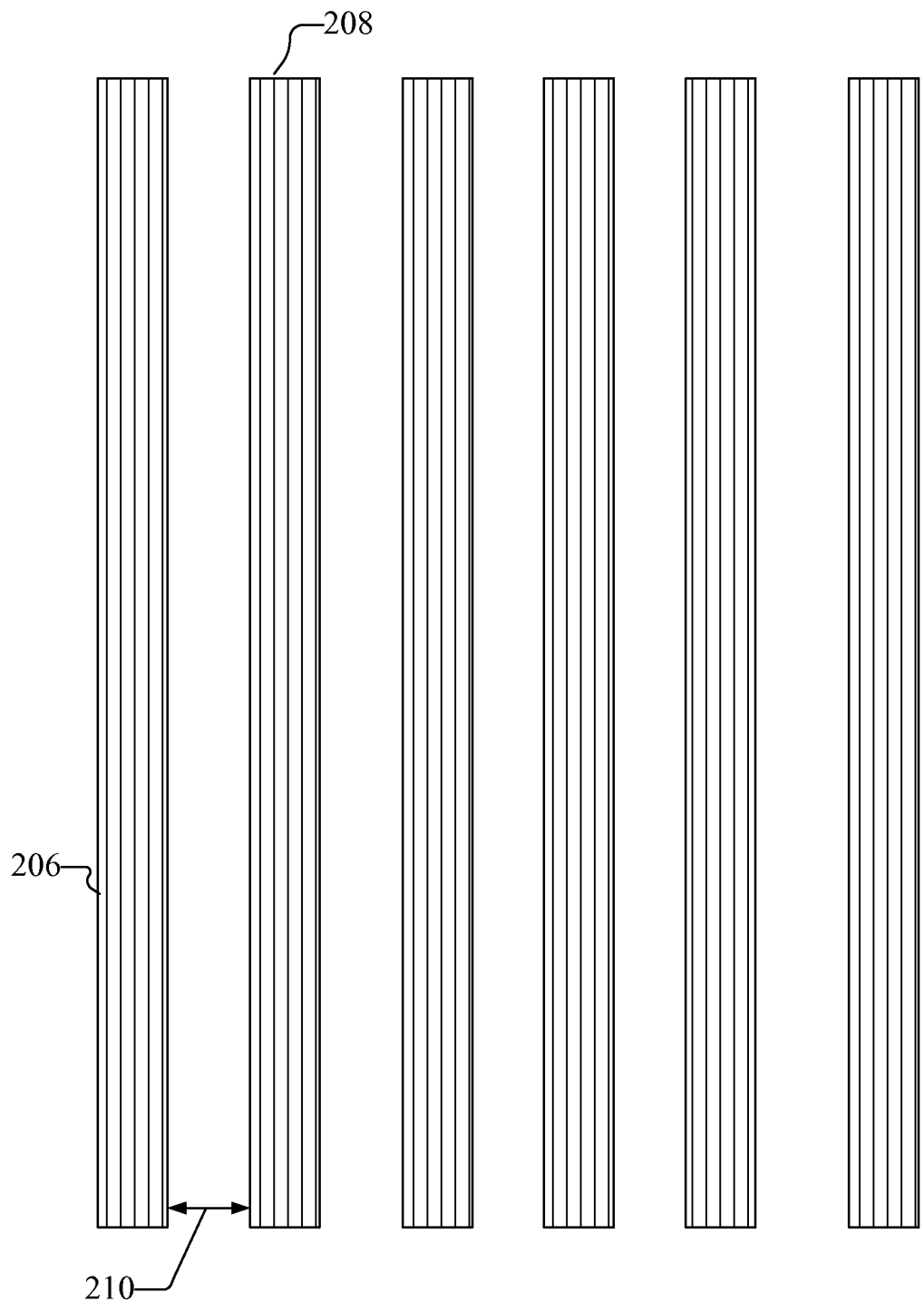
FIG. 2 is a diagram of fingers that are part of at least one metal layer.

FIG. 2 is a diagram of fingers that are part of at least one metal layer of the first capacitor structure. While FIG. 1 illustrated a design for one or more metal layers, FIG. 2 is another design for one or more metal layers. The metal layers of FIG. 1 and FIG. 2 may then be overlapped as shown and discussed with respect to FIG. 4, which shows the first capacitor structure. FIG. 2 illustrates a design for one or more of the metal layers of the first capacitor structure. In particular, FIG. 2 illustrates a plurality of vertical fingers (finger 206 and finger 208 are the first two fingers and the only fingers labeled). There may be six vertical fingers 206 as shown in FIG. 2, or there may be more or fewer fingers. In one embodiment, the number of vertical fingers 206 may match the number of fingers from the layer in FIG. 1. If there are 17 fingers in the layer from FIG. 1, then there may be 17 vertical fingers 206 in one embodiment. The gap 210 between the vertical fingers 206 may be the same as the gap 110 between the fingers of layer from FIG. 1. The layer illustrated in FIG. 2 includes longer vertical fingers and the longer the finger, the higher the effective fringe capacitance.

Figure 3:
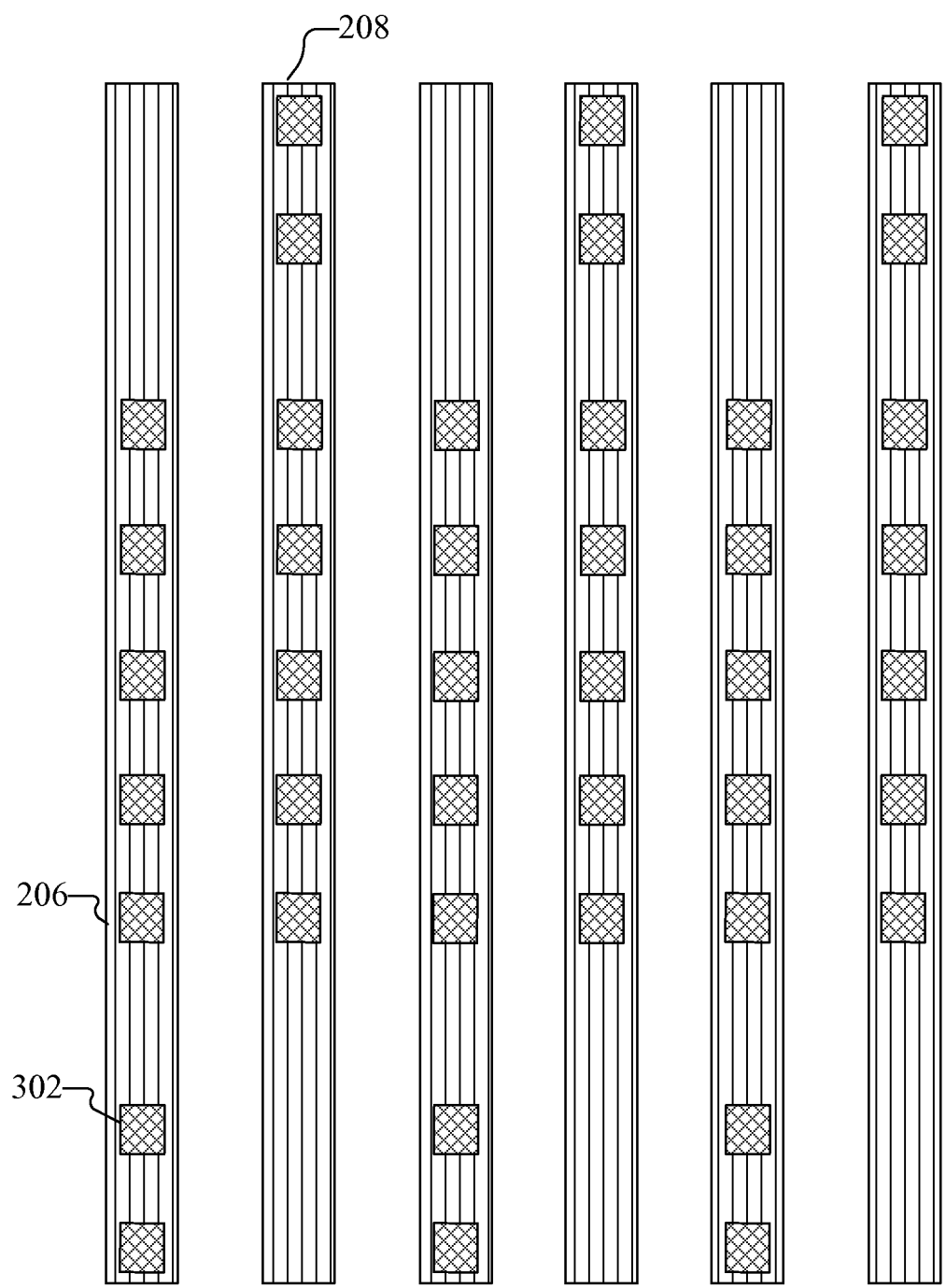
FIG. 3 is a diagram of vias on the fingers that are part of at least one metal layer.

FIG. 3 is a diagram of vias on the fingers shown in FIG. 2. In particular, the first capacitor structure of FIG. 2 may include a plurality of vias as shown. A via may be a contact between different metal layers. In one embodiment, the structure as illustrated in FIG. 3 may be from a single metal layer and the other metal layers that are combined with that layer are each merely vertical fingers that extend for the entire height of the structure. There may be a set of vias that act as a contact between the metal layers. For example, there may be a set of vias that act as a contact between a first and second metal layer and another set of vias that act as a contact between a third and fourth metal layer.

Vias may be tinny structures connecting wires from different layers of a multilayer integrated circuits, printed circuit boards or packages. Vias make electrical connections between layers on a integrated circuit or printed circuit board. They can carry signals or power between layers. For backplane designs, the most common form of vias use plated through hole ("PTH") technology. A PTH in a printed circuit board ("PCB") may be used to provide electrical connection between a wire on one layer of the PCB to a wire on another layer. Since it is not used to mount component leads, it may be a small hole and pad diameter. A via may be a physical piece of metal that makes an electrical connection between layers on the PCB. Vias may carry signals or power between layers using PTH. A via may be formed by drilling a hole through the layers to be connected and then plating the inner surface of the drilled hole. Vias may be sized according to the wires being connected between layers and based on an amount of power carried for the connection.

High Density Interconnects ("HDI") may be another via technology used to form very small vias where drilling holes, using a conventional drill bit, is impractical. Also known as micro-vias, this technology may create the hole with a laser before plating. Via aspect ratio is defined as the ratio of the circuit board thickness to the smallest unplated drilled hole diameter and may be used to specify the minimum via hole size for a particular design. The smaller the aspect ratio, the more consistent the plating is throughout the length of the via. Larger aspect ratio vias tend to have more plating at each end compared to the middle.

In FIG. 3, the vias may be placed along the vertical fingers. The length of the fingers may be increased, while the spacing between the fingers is also increased as discussed with respect to FIG. 2. The length of the fingers results in higher capacitance and the spacing between fingers being increased improves reliability. The combination of increasing finger length and increasing the gap or spacing between fingers may mean that fewer fingers are used so that the square area is not increased. The vias being placed along the vertical fingers may result in a slightly increased capacitance that results in a capacitance level that is comparable to a structure with a smaller spacing or gaps between fingers. In an alternative embodiment, each finger may include one or more vertical vias. As shown, the vias are square, but a longer vertical via may be used for each of the fingers to further increase capacitance.

In one embodiment, vias along the vertical fingers may reduce capacitance between layers or plates. Depending on the structure, there may be a capacitance between plates that is reduced or eliminated around the vias. While the vias may increase the sidewall or fringe capacitance between fingers, they may also decrease the inter-plate capacitance between metal layers. The capacitance between layers may be referred to as a gap capacitance, vertical capacitance or coupling capacitance and the capacitance between fingers or between the edges of fingers may be referred to as a sidewall or fringe capacitance.

The arrangement of the vias 302 may be different for the odd and even columns of vertical fingers. As shown, vertical finger 302 is the first odd vertical finger and vertical finger 304 is the first even vertical finger. The odd vertical fingers may include one or more vias near a bottom of the vertical finger with no vias near a top of the vertical finger. Conversely, the even vertical fingers may include one or more vias near a top of the vertical finger with no vias near a bottom of the vertical finger. The reason for the alternating vias near the top and bottom of fingers is shown in FIG. 4 as a result of combining with the layer from FIG. 1.

Figure 4:
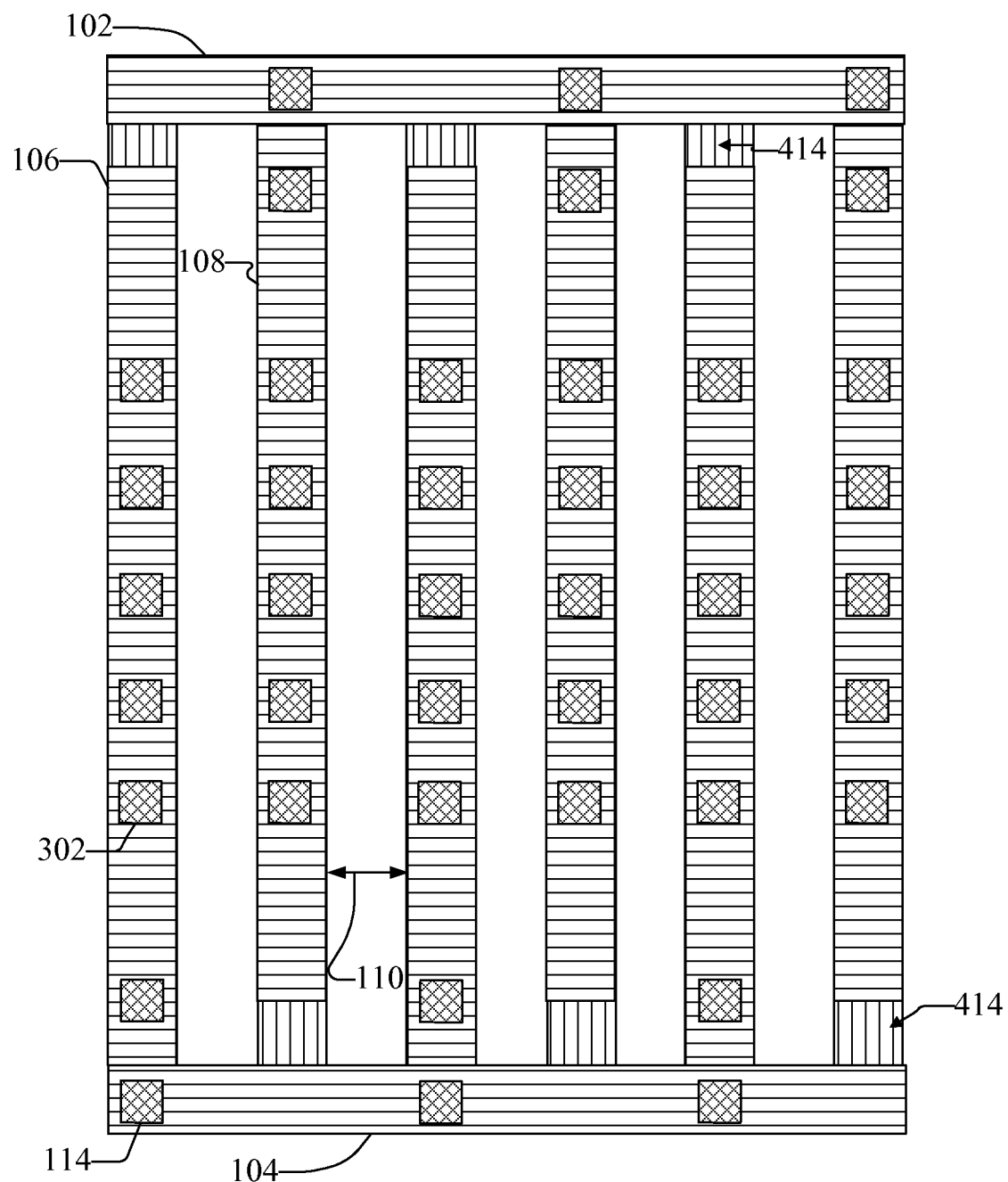
FIG. 4 is a combined diagram of the capacitor structure including the at least one metal layer and the fingers with vias.

FIG. 4 is a diagram of the first capacitor structure. In particular, FIG. 4 may be an illustration of the combination of the layer or layers from FIG. 1 and the layer or layers from FIG. 3. As described, there may be more than two layers and FIG. 3 may be illustrative of the layers of several different types of metal. In one embodiment, one metal layer may be arranged as in FIG. 1 and there may be several other metal layers arranged as in FIG. 3. In other words, the other metal layers are just vertical fingers (FIG. 3), while one of the metal layers (FIG. 1) include the top and bottom rows with fingers that extend from only one of those rows. The combination of the layers results in a structure with improved capacitance. The metal layers are connected with one another through the vias that are located along the vertical fingers.

Since FIG. 4 represents a structure with multiple layers (including the layer from FIG. 1 and the layer from FIG. 3), the vertical fingers from FIG. 3 may be present in the gaps 414 above/below the fingers from the layer of FIG. 1. Two gaps 414 are labeled in FIG. 4 that would include metal from another layer (e.g. FIG. 3). Although not shown, the fingers from FIG. 3 extend the length of the fingers in FIG. 4 and each of the fingers in FIG. 4 may include a gap at which the vertically extending fingers from FIG. 3 are present. In one embodiment, the gap between fingers may be 90 nm and the width of the fingers may be 100 nm. The finger length may be 2,810 nm.

Figure 5:
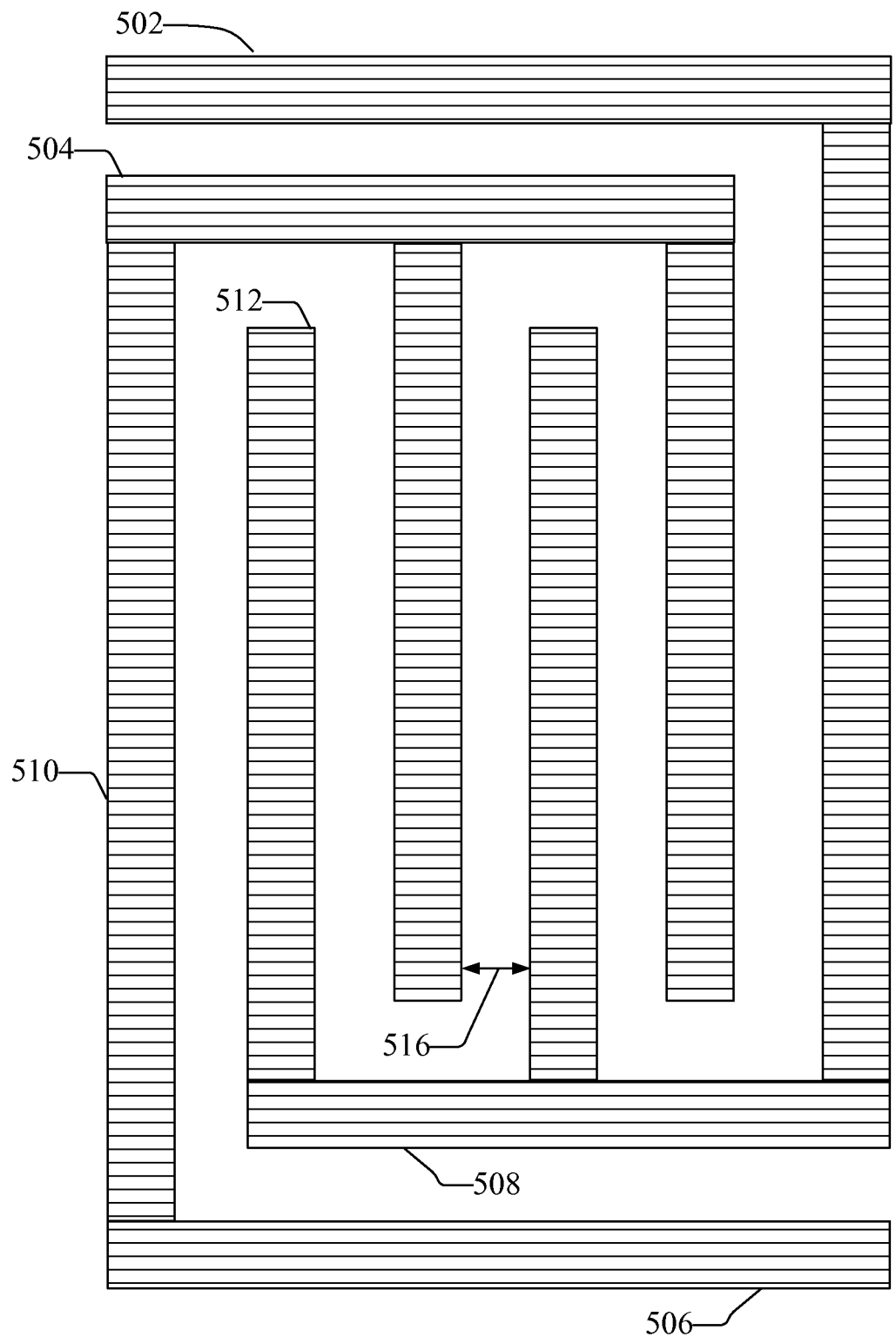
FIG. 5 is a diagram of at least one metal layer that is part of another capacitor structure.

FIG. 5 is a diagram of at least one metal layer that is part of a second capacitor structure. FIG. 5 differs from the layer from FIG. 1 because it includes two sets of horizontal rows. As with FIG. 1, FIG. 5 includes a top row 502 and a bottom row 506. A second, lower horizontal row 504 is located below the top row 502. A second, higher horizontal row 508 is located above the bottom row 506. The first finger 510 couples the bottom row 506 and the second top row 504. The second finger 512 couples the top row 502 and the second bottom row 508. The odd fingers (starting with the first finger 510) each extend from the second top row 504. The even fingers (starting with the second finger 512) each extend from the second bottom row 508. The gap 516 between fingers may be the same as the gap 110 and gap 210 as discussed above.

Figure 6:
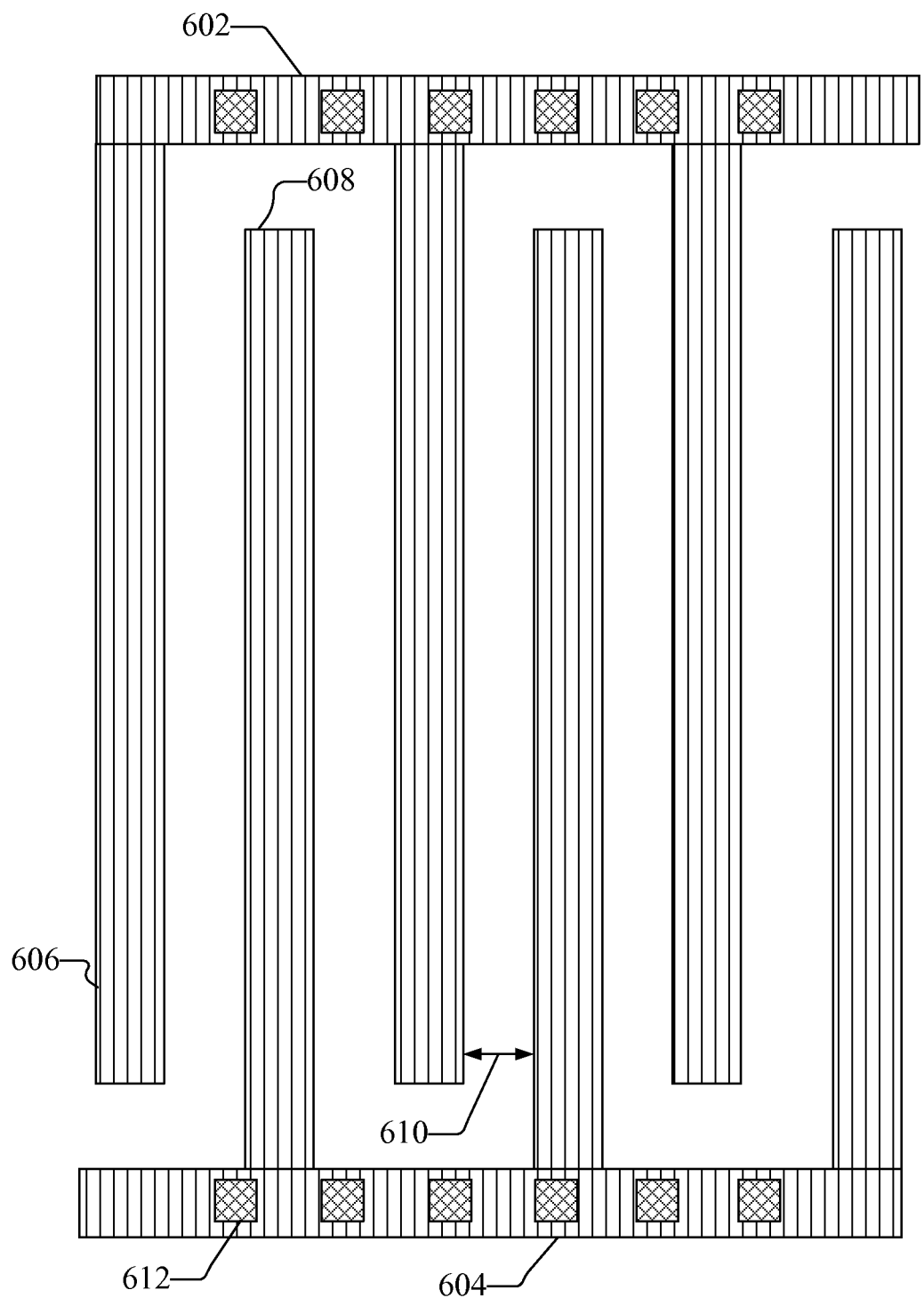
FIG. 6 is a diagram of another metal layer that is part of another capacitor structure.

In one embodiment, the layer in FIG. 5 may be wire from one metal. There may be multiple metal layers arranged as shown in FIG. 5 that form part of the second capacitor structure shown in FIG. 7. FIG. 6 illustrates an arrangement for one or more of the layers that also form part of the second capacitor structure. FIG. 6 is a diagram of another metal layer that is part of the second capacitor structure. More specifically, FIG. 6 illustrates the next metal layer adjacent the one shown in FIG. 5. The second capacitor structure may be formed by alternating FIG. 5 and FIG. 6 one above the other in different metal layers.

FIG. 6 includes a similar structure as the layer from FIG. 1 with odd fingers (starting with the first finger 606) extending from a top row 602 and even fingers (starting with second finger 608) extending from the bottom row 604. There are vias disposed on both the top row 602 and bottom row 604. There may be more or fewer vias and they may be arranged differently along the top and bottom rows. In one embodiment, more vias are included adjacent one another along each row. Different shaped vias may be utilized rather than the square shaped vias shown in FIG. 6.

Figure 7:
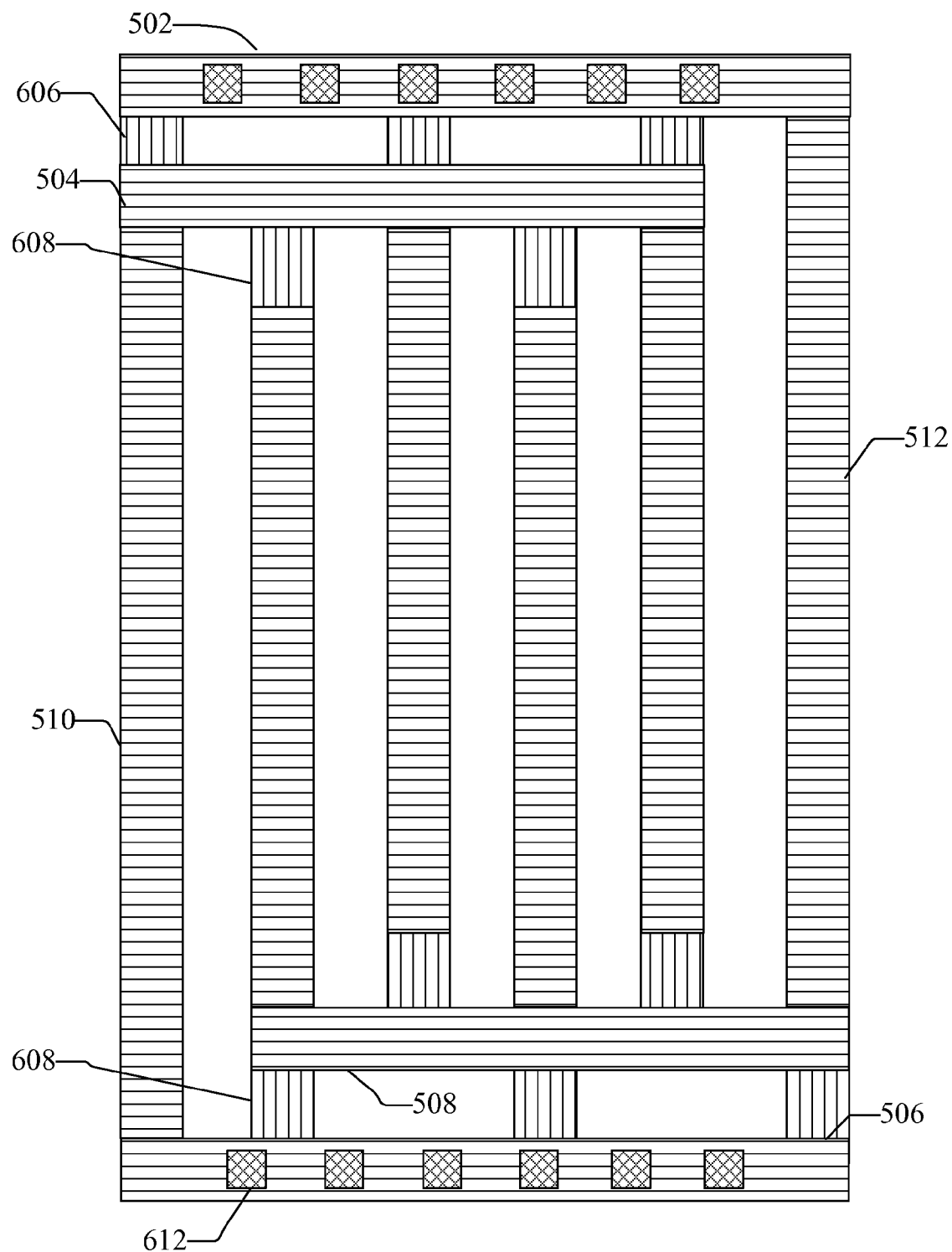
FIG. 7 is a combined diagram of another capacitor structure including the at least one metal layer and the fingers with vias.

FIG. 7 is a combined diagram of the second capacitor structure including the at least one metal layer and the fingers with vias. In particular, the second capacitor structure of FIG. 7 may be a combination of the layer from FIG. 5 and the layer from FIG. 6. In some embodiments, the second capacitor structure of FIG. 7 may include a plurality of layers arranged as in FIG. 5 with different metals and a plurality of layers arranged as in FIG. 6 with different metals. The layers that are combined for FIG. 7 are illustrated with the layer from FIG. 5 "on top" of the layer from FIG. 6. This is evident by the portions from FIG. 6 (fingers 606, 608) being displayed in the gaps from the layer of FIG. 5. The vias 612 connect the different metal layers. The lack of vias along the vertical fingers increases the gap or overlap capacitance between layers. The spacing between the vias may be maximized based on manufacturing constraints requiring a minimum distance between vias. Vias may not be included in the vertical fingers because the fingers that are one above the other are not connected. Fingers one above the other which are in different metal layers are alternately connected to a top and bottom plate.

In one embodiment, the second capacitor structure illustrated in FIG. 7 may include 16 fingers each of a width of 100 nanometers. The spacing between fingers is 90 nm and the length of the fingers may be 1890 nm. The capacitance per area of the second capacitor structure is high because of the sidewall or fringe capacitance as well as the coupling or gap capacitance between layers. The capacitance is achieved while the gap or spacing between fingers is increased for increased reliability.

The manufacture of the layers described herein may be designed and optimized utilizing a computer with the specifications and features described. As used herein, "computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a processor, memory device, computer and/or machine memory.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

We claim:

1. A metal-oxide-metal capacitor formed by a plurality of metal layers comprising:
   a first set of fingers located on a first metal layer comprising a plurality of vertical fingers and one horizontal finger at a top of the vertical fingers and one horizontal finger at a bottom of the vertical fingers, wherein each of the vertical fingers are connected with either the one horizontal finger at a top or the one horizontal finger at a bottom;
   a second set of fingers located on a second metal layer comprising a plurality of vertical fingers and two horizontal fingers at a top of the vertical fingers and two horizontal fingers at a bottom of the vertical fingers;
   vias on the one horizontal finger at the top of the vertical fingers of the first set of fingers that connect with one of the horizontal fingers at a top of the vertical fingers of the second set of fingers; and
   vias on the one horizontal finger at the bottom of the vertical fingers of the first set of fingers that connect with one of the horizontal fingers at a bottom of the vertical fingers of the second set of fingers,
   wherein the vertical fingers in the first set of fingers are parallel to and correspond with the vertical fingers in the second set of fingers.

2. The capacitor of claim 1 wherein the fingers of each of the layers generate a fringe or sidewall capacitance to store electrical energy.

3. The capacitor of claim 2 wherein the finger length is increased to increase the fringe capacitance.

4. The capacitor of claim 2 wherein a plate capacitance occurs between the alternate layers placed on top of each other.

5. The capacitor of claim 4 wherein a total capacitance for the capacitor is a combination of the fringe capacitance and the plate capacitance.

6. The capacitor of claim 1 further comprising a third metal layer adjacent the second metal layer.

7. The capacitor of claim 6 further comprising vias connecting the second metal layer with the third metal layer.

8. The capacitor of claim 1 wherein spacing between fingers is increased to improve reliability of the capacitor and yield of final product.

9. A semiconductor structure comprising:
   a substrate;
   a multi-finger capacitor comprised of a plurality of metal layers disposed on the substrate, wherein the multi-finger capacitor comprises:
      a first layer with a first set of fingers comprising a plurality of vertical fingers and one horizontal finger at a top and one horizontal finger at a bottom of the vertical fingers;
      a second layer with a second set of fingers comprising a plurality of vertical fingers and two horizontal fingers at a top and two horizontal fingers at a bottom of the vertical fingers, wherein the vertical fingers in the first set are parallel to and correspond with the vertical fingers in the second set; and
      a plurality of vias connecting the first layer and the second layer, wherein on the first set of fingers at least some of the vias connect to the one horizontal finger at the top of the vertical fingers and at least some of the vias connect to the one horizontal finger at the bottom of the vertical fingers;
   wherein a capacitance of the multi-finger capacitor comprises a sidewall capacitance between fingers and a plate capacitance between layers.

10. The structure of claim 9 wherein for the first set of fingers every other finger is coupled with either the top horizontal finger or the bottom horizontal finger.

11. The structure of claim 9 wherein the vias are disposed on the one horizontal finger at the top and the one horizontal finger at the bottom of the vertical fingers.

12. The structure of claim 11 wherein spacing between fingers is increased to improve reliability of the capacitor.

* * * * *